United States Patent [19]
Turner

[11] 3,940,595
[45] Feb. 24, 1976

[54] ELECTRONIC THERMOMETER DECODER AND DISPLAY SYSTEM

[75] Inventor: Robert Bruce Turner, Weymouth, Mass.

[73] Assignee: American Medical Electronics Corporation, Newton Upper Falls, Mass.

[22] Filed: May 30, 1974

[21] Appl. No.: 474,400

[52] U.S. Cl. ........ 235/92 EA; 340/336; 235/92 MT; 73/362 R; 340/347 AD
[51] Int. Cl.² ........................................ G06M 3/06
[58] Field of Search ......... 73/362, 359; 235/92 MT, 235/92 T, 92 EA; 324/99 R, 99 D, 78 D; 340/347 AD, 336

[56] References Cited
UNITED STATES PATENTS

| | | | |
|---|---|---|---|
| 3,274,832 | 9/1966 | Hamilton | 73/339 |
| 3,619,574 | 11/1971 | Mindheim | 235/92 EA |
| 3,620,082 | 11/1971 | Peters | 73/362 AR |
| 3,672,218 | 6/1972 | Hartman | 73/362 AR |
| 3,702,076 | 11/1972 | Georgi | 73/362 AR |
| 3,766,535 | 10/1973 | Deebel et al. | 340/181 |
| 3,768,310 | 10/1973 | Krepak | 73/362 AR |
| 3,791,214 | 2/1974 | Keith | 73/362 AR |
| 3,798,428 | 3/1974 | Izawa | 235/168 |
| 3,817,105 | 6/1974 | Luhowy | 73/362 AR |

*Primary Examiner*—Charles D. Miller
*Attorney, Agent, or Firm*—Joseph S. Iandiorio

[57] ABSTRACT

An electronic thermometer system for measuring and displaying temperature in more than one power of a radix comprising a first radix counter for counting pulses representative of the temperature measured; a first display device for displaying the count in the first radix counter; a radix power increment circuit responsive to the first radix counter cycling through a first radix count for indicating that the first next radix power has been reached; a second display device for displaying the first radix power; and a decoder responsive to the radix power increment circuit for indicating that the first next radix power has been reached for setting a first predetermined number in the second display device.

3 Claims, 5 Drawing Figures

ELECTRONIC THERMOMETER DECODER AND DISPLAY SYSTEM

FIELD OF INVENTION

This invention relates to an electronic thermometer system which measures and displays temperature or temperature and time in a predetermined number of powers of radix, using less than that number of counters.

BACKGROUND OF INVENTION

Electronic thermometers are becomingly increasingly more attractive as their cost decreases. Although their initial cost may be relatively high, the cost over their extended period of use is comparable to that of mercury thermometers, especially when the electronic thermometers are used with disposable probe covers and the cost of repeated sterilization and breakage allowances for mercury thermometers is considered. Some electronic thermometers employ circuitry similar to digital volt meters which is neither the best suited nor most inexpensive approach for implementing thermometer systems. Thermometer systems, especially those used in patient care, require only limited range capability which admits of much simplification relative to broader range systems and renders redundant many circuits used in such instances.

SUMMARY OF INVENTION

It is therefore an object of this invention to provide an electronic thermometer system which measures and displays temperature in a predetermined number of powers of radix using less than that number of counters and less associated circuitry.

It is a further object of this invention to provide such a system which is small, compact, inexpensive, light weight and uses a minimum of circuitry yet provides high speed and accurate measurement.

It is a further object of this invention to provide such a system which in addition measures and displays a fixed period of time as a reference for the user.

The invention features an electronic thermometer system for measuring and displaying temperature in more than one power of a radix. There is a first radix counter for counting pulses representative of the temperature measured. A first display device displays the count in that first radix counter. A radix power increment circuit is responsive to the first radix counter cycling through a first radix count for indicating that the first next radix power has been reached. A second display device displays the first next radix power and a first decoder is responsive to the radix power increment circuit giving an indication that the first next radix power has been reached for setting a first predetermined number in the second display device.

In a preferred embodiment there is a third display device for displaying the second next radix power and the radix power increment circuit is responsive to the first radix counter cycling through a second radix count for indicating that the second next radix power has been reached. The decoder is responsive to the radix power increment circuit indicating that the second next radix power has been reached for displaying a different predetermined number in the second display device in place of the first predetermined number and displaying a second predetermined number in the third display device.

DISCLOSURE OF PREFERRED EMBODIMENT

Other objects, features and advantages will occur from the following description of a preferred embodiment and the accompanying drawings, in which:

FIG. 2 is a more detailed block diagram of the system of FIG. 1;

Figure 1:
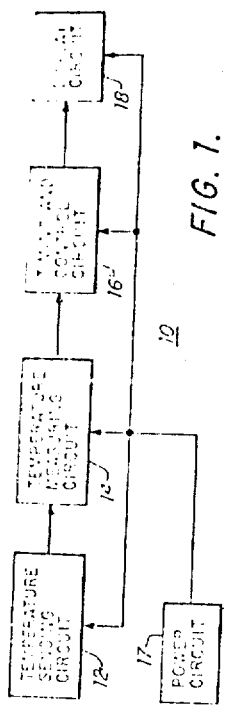
FIG. 1 is a simplified block diagram of an electronic thermometer system using a display circuit according to this invention.

The invention may be accomplished in an electronic thermometer system for measuring and displaying both time and temperature in more than one power of a radix, wherein the time is measured and displayed in a time mode period and the temperature is displayed in a temperature mode period.

In a preferred embodiment there are four display devices: a least significant digit display device, a next to least significant digit display device, a next to most significant digit display device, and a most significant digit display device.

A least significant digit radix counter counts the pulses representative of the temperature being measured and the least significant digit display device displays that count. A next least significant digit display counter counts the number of times that the least significant digit radix counter has cycled through a radix count and the count in that next to least significant digit counter is displayed in the next least significant digit display device. There is a radix power increment circuit responsive to the next to least significant digit radix counter having cycled through a first radix count for indicating that the first next radix power has been reached. The radix power increment circuit also responds to the next to least significant digit radix counter having cycled through a second radix count for indicating that the second radix power has been reached. The next most significant digit display device displays the first next radix power and the most significant digit display device displays the second next radix power.

A decoder, responsive to the radix power increment circuit having indicated that the first next radix power has been reached sets a first predetermined number in the next most significant digit display device and responds to the radix power increment circuit having indicated that the second next radix power has been reached to set a different predetermined number in the next most significant digit display device and a second predetermined number in the most significant digit display device.

If the system is used to measure both time and temperature the least significant digit display counter will count pulses representative of the temperature measurement in the temperature mode period and pulses representative of the time measurement during the time mode period. The least significant digit display device displays the count in the least significant digit radix counter during the temperature mode period but need not display the count in the least significant digit radix counter during the time mode period if the accuracy of the time measurement is not required to be as precise as that for the temperature measuring period. In both the time mode period and temperature mode period the radix power increment circuit responds to the next to least significant digit radix counter having cycled through a first radix count to indicate that the first next radix power has been reached and responds to the next to the least significant digit radix counter having cycled through a second radix count to indicate that the second next radix power has been reached. The decoder responds to the radix power increment circuit indicating that the first next radix power has been reached, in each period, to set a predetermined number in the next most significant digit display device and to an indication that the second next radix power has been reached during the temperature mode period, but not necessarily during the time mode period, to set a different predetermined number in the next most significant digit display device and a second predetermined number in the most significant digit display device. In this manner the system permits temperature measurement to four place accuracy using all four display devices while providing a two place accuracy for time measurement. These provisions are sufficient where, for example, as in the medical field the temperature range may be limited to 90.0°F through 110.0°F and the time to be measured may be on the order of 20 seconds, typically to be used to measure human pulse rate.

While four display devices have been suggested as few as two may be used in accordance with this invention. The radix used is most typically 10 since conventionally temperature is measured in the decimal system.

There is shown in FIG. 1 an electronic thermometer system 10 according to this invention including a temperature sensing circuit 12 which senses variation in temperature and provides a signal representative thereof to temperature measuring circuit 14 which provides a signal representative of the temperature sensed to timing and control circuit 16. Timing and control circuit 16 establishes an operation interval including a time mode period and a temperature mode period during which the time and temperature are displayed by display circuit 18. Timing and control circuit 16 generates pulses for measuring a fixed period of time during the time mode period and selectively provides at its output either those pulses during the time mode period or the signal measuring the sensed temperature during the temperature mode period. Power is provided to each of circuits 12, 14, 16 and 18 by power circuit 17.

In one specific embodiment temperature sensing circuit 12 may include a probe 20, FIG. 2, for sensing a temperature to be measured and producing an analog signal representative thereof which is submitted through internal reference circuit 22 to bridge circuit 24. Internal reference circuit 22 selectively connects a matching circuit to bridge circuit 24 in place of the input from probe 20 so that the accuracy and operation of the system can be verified. Bridge circuit 24 provides a reference output on line 26 and on line 28 provides a varying output as a function of the bridge imbalance representing the analog signal which is a function of the temperature sensed by probe 20. In this system used primarily to take the temperatures of humans the measurement range is from 90° to 110°F. Thus reference output 26 of bridge circuit 24 represents the level of 90°F; when output 28 of bridge circuit 24 is equal to reference output 26 thermometer probe 20 is measuring a temperature of 90°F. When output 28 is at a predetermined deviation from the level of output 26 probe 20 is measuring 110°F. Output 28 is fed to anticipation circuit 30 which senses the rate of change of the temperature being sensed by probe 20 and adds to the signal on output 28 from bridge circuit 24, thereby providing a signal at summing point 32 in voltage to rate converter 14 representative of the final value of the temperature being sensed in advance of the actual sensing of that final value.

In measuring circuit 14 the signal at summing point 32 is directed to the negative input of integrator circuit 34 whose positive input receives reference output 26 from bridge circuit 24. A difference between summing point 32 and reference output 26 at the input to integrator 34 causes it to provide a positive slope ramp at its output to constant width pulse generator 26, which provides a negative going pulse of fixed width when the ramp reaches a predetermined voltage level. The fixed width pulse is delivered along feedback line 38 to reference current switch 40 which produces a positive going pulse having fixed width and fixed amplitude and delivers it to summing point 32. The presence of this pulse momentarily restores summing point 32 to the level of output 26 causing the integrator circuit output to drop resulting in a sawtooth output signal. Constant width pulse generator 36 then produces no further pulses to reference current switch 40. Therefore no pulses are delivered to summing point 32 and the level at summing point 32 once again moves away from that at the reference output 26. This causes integrator circuit 34 to provide another positive ramp and the cycle to begin again. Since the pulses fed back to summing point 32 have fixed width and fixed amplitude it is the rate of those pulses which must adjust to the relative imbalance between summing point 32 and reference output 26. Thus the greater the difference between these two inputs to integrator circuit 34 the higher will be the repetition rate of the pulses provided at the output of constant width pulse generator 36 and this repetition rate is proportional to the temperature being sensed by probe 20. The illustrated configuration of measuring circuit 14 in FIG. 2 which includes summing point 32, integrator circuit 34, constant width pulse generator 36, feedback line 38 and reference current switch 40 is but one example of a voltage to rate converter which may be used. For example a voltage controlled oscillator or other means for producing an output whose frequency varies in proportion to an analog input signal may be used.

Control and display circuit 18 includes digital counting and decoding circuit 42 which counts the digital pulses provided at the output of constant width pulse generator 36 and decodes that count to display the measured temperature in digital display 44.

All power to the system from power supply 46 is controlled by automatic on-off switch 48 which is turned on by actuation of start switch 58 and remains on independently of further operation of switch 58 until the operation interval including the time mode and temperature mode periods has ended and then automatically turns off. Precision voltage regulator 50 provides regulated voltage, PVR, to bridge circuit 24, reference current switch 40, integrator circuit 34, constant width pulse generator 36 and low battery voltage sensing circuit 52. The other input to low battery voltage sensing circuit 52 is the unregulated power supplied at the output of automatic on-off electronic switch 48. When the unregulated power supply voltage decreases to a predetermined level relative to the regulated voltage output provided by precision voltage regulator 50, low battery voltage sensing circuit 52 provides a signal to digital counting and decoding circuit 42 causing it to extinguish the least significant digit of the temperature appearing in digital display 44.

Electronic thermometer system 10 operates in two modes: a time mode and a temperature mode. Digital control logic 54 supervises system performance in each of these modes and controls the transistion between them. In the time mode digital control logic 54 passes time measuring pulses from clock 56 to digital counting and decoding circuit 42, while in the temperature mode digital control logic 54 directs temperature measuring pulses from constant width pulse generator 36 to digital counting and decoding circuit 42. The system is operated by actuation of start switch 58.

In operation when start switch 58 is actuated automatic on-off electronic switch 48 is turned on to supply power from power supply 46 to the rest of the system and digital control logic 54 and digital counting and decoding circuits 42 are reset. Probe 20 in contact with the patient whose temperature is to be measured begins to sense the temperature. The voltage E at output 28 of bridge circuit 24 decreases, increasing the negative current I at summing point 32. The difference in levels of output 26 and summing point 32 causes pulses to be generated at the output of constant width pulse generator 36 at a repetition rate required to restore summing point 32 to the proper level. The repetition rate of the pulses at the output of constant width pulse generator 36 stabilizes in a short period of time to represent the final value of the temperature being sensed. This time may be reduced still further by the use of anticipation circuit 30 as explained previously.

Simultaneously with this action, upon the actuation of start switch 58, automatic on-off electronic switch 48 is latched by a signal on line 60 from digital control logic 54 to sustain automatic on-off switch 48 in the on condition during the time and temperature mode periods. In this particular embodiment, the time mode period precedes the temperature mode period and their durations are typically 20 seconds and 10 seconds, respectively. Simultaneously with the actuation of start switch 58 digital control logic 54 passes clock pulses from clock 56 to digital counting and decoding circuit 42. These clock pulses may have a duration of 100 milliseconds so that a count of 10 such clock pulses by digital counting and decoding circuit 42 indicates 1 second. At the end of each second so accumulated digital display 44 is enabled to display the numbers 1 through 19 representing the time. At the end of the 20th second digital control logic 54 transfers the system into the temperature mode by permitting passage, for the period of one clock pulse, of the pulses at the output of constant width pulse generator 36 to digital counting and decoding circuit 42 which accumulates and decodes the count and causes the temperature to be displayed.

Figure 3:
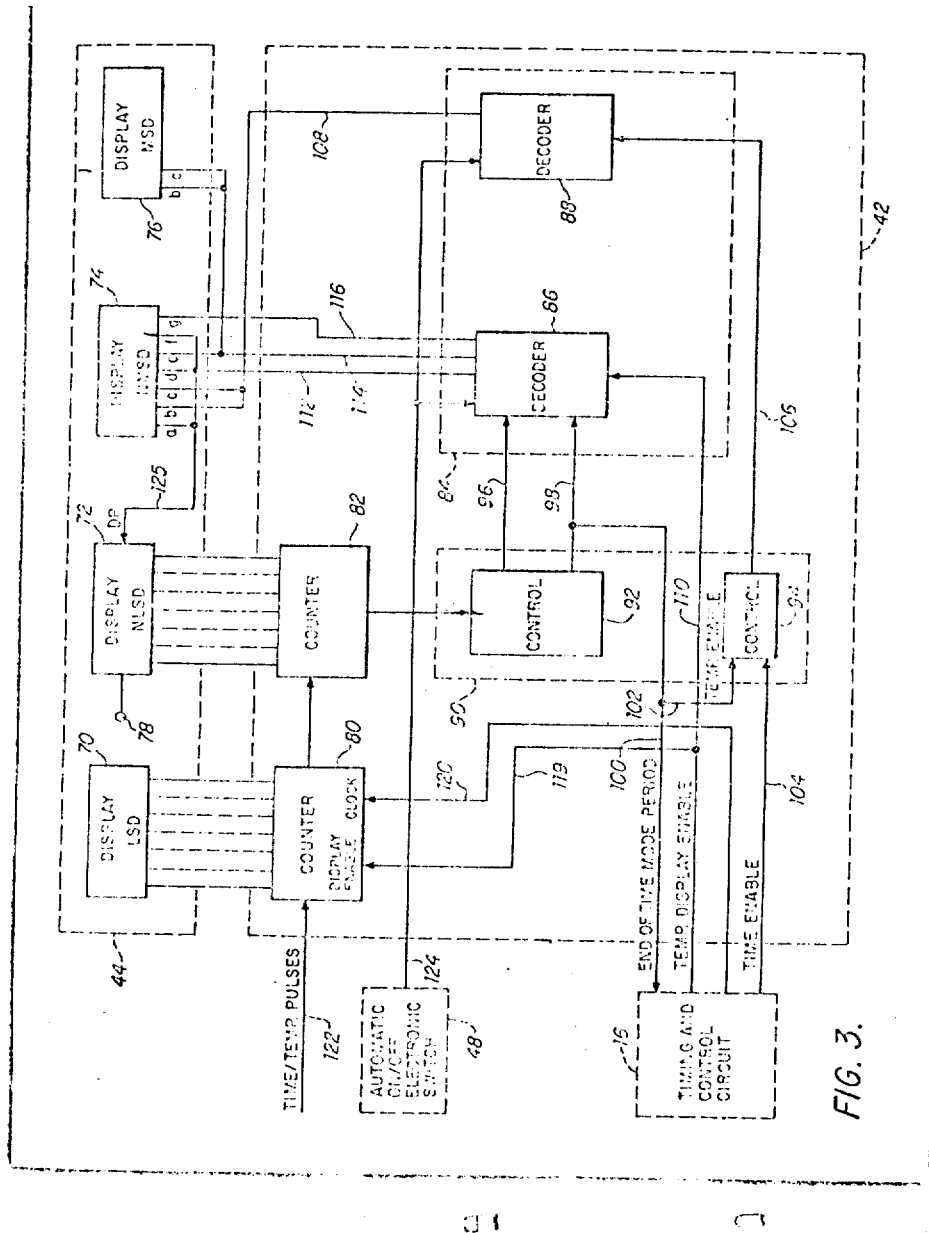
FIG. 3 is a more detailed block diagram of the digital counting and decoding circuit and digital display shown in FIG. 2.

Digital display 44 may include four displays, FIG. 3, arranged to provide a four place digit display including least significant digit display 70, next to least significant digit display 72, next to most significant digit display 74 and most significant digit display 76. In the decimal system, radix 10, display 70 will represent the power 10 to the minus 1 or tenths; display 72 the power 10 to the one or units; display 74 10 to the two or tens position; and display 76 10 to the three or hundreds position. Display 72 also controls decimal point display 78.

Digital counting and decoding circuit 42 includes the first power counter 80, and second power counter 82 which are directly connected to their associated displays 70, 72. Counter 80 is also connected directly to counter 82 so that each time counter 80 reaches a full count of ten a signal is provided to counter 82. Time and temperature pulses are selectively fed to the input of counter 80. Digital counting and decoding circuit 42 also includes a decoder circuit 84 including decoder 86 and decoder 88. Control circuit 90 includes control 92 and control 94. Control 92 initially provides a low output on line 96 and a high output on line 98 to decoder 86. After counter 82 has counted to a full count representing the accumulation of ten cycles or a hundred counts by counter 80 the output on line 96 goes from low to high and the output on line 98 goes from high to low. During the initial state of control 92 the high output on line 98 does not constitute the end of time mode period on line 100 nor a temperature enable signal on line 102: it provides a high output on line 102 which in conjunction with the high output on line 104 causes the output of control 94 on line 106 to go low and inhibit decoder 88 so that no output is produced on line 108 to energize bars $b$ and $c$ of display 74. Upon the first signal from counter 82 the output on line 96 goes high and that on line 98 goes low. This negative going transition and subsequent negative level on line 98 does not constitute an end of time mode period signal on line 100; it does provide a low level on line 102 which despite the presence of the high level on line 104 will cause the output of control 94 on line 106 to go high enabling decoder 88 to provide an output on line 108 and energize bars $b$ and $c$ in display 74.

At the next signal from counter 82 to control 92 upon completion of the second counting cycle of counter 82, line 96 will again go low and line 98 will go high. This positive transition on line 98 does constitute an end of time mode period on line 100 signifying the end of the time mode period to timing and control circuit 16. In response, timing and control circuit 16 removes the time enable signal on line 104 so that even though the signal on line 102 is high the low signal on line 104 is sufficient to keep the output of control 94 on line 106 high so that decoder 88 remains enabled and the output on line 108 sustains the operation of bars $b$ and $c$ in display 74.

During this first two cycles of operation of counter 82 temperature display enable line 110 was low inhibiting decoder 86 so that regardless of the state of the outputs on lines 96 and 98 no outputs were provided on lines 112, 114 and 116 of decoder 86 to energize bars $a$, $d$, and $f$ in display 74 or bar $e$ in display 74 and bars $b$ and $c$ in display 76, or bar $g$ in display 74, respectively.

Figure 4:
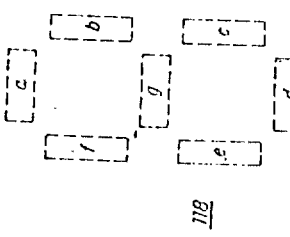
FIG. 4 is a diagram of a matrix unit which may be used in the displays as shown in FIG. 3.

Each of the displays 70, 72, 74 and 76 includes a matrix 118, FIG. 4 which includes seven bars labelled $a, b, c, d, e, f$ and $g$. When bars $b$ and $c$ are energized the matrix displays a 1; when bars $a, b, c, d, f$ and $g$ are energized the matrix displays a 9; when bars $a, b, c, d, e$ and $f$ are displayed the matrix displays a 0; and so on.

The temperature mode thus begins with bars $b$ and $c$ of display 74 enabled by the output on line 108 and the bars $a, d, f$ and decimal point of display 72 energized by output on line 112 regardless of the condition of the outputs on lines 96 and 98 from control 92. At the beginning of the temperature mode period, a high output on line 98 of control 92 causes decoder 86 to provide an output on line 116 which energizes bar g in display 74 so that the combination of energized bars b and c from lines 108, a, d and f from line 112 and bar g from line 116, form the number 9. If the temperature reaches 100°F or above a signal from counter 82 changes the state of control 92 so that the output on line 96 goes high and the output on line 98 goes low. This removes the enabling output on line 116 and provides instead an output on line 114 which enables the e bar in display 74 and the b and c bars of display 76. Thus the combination of energized bars in display 74, b, c, a, d, f and e, produce the number zero while the enabled bars b and c in display 76 produce the number 1. The absence of the temperature display enable signal on line 110 may be used on line 119, connected to the display enable input of counter 80, to prevent the contents of counter 80 from being displayed in display 70 during the time mode period but enabling the contents of counter 80 to be displayed in display 70 during the temperature mode period. The signal on line 120 from timing and control circuit 16 to the clock input of counter 80 enables counter 80 to count time pulses on line 122 for the entire duration of the time mode period and to count temperature pulses on line 122 during only the first clock pulse of the temperature mode period. At the end of the temperature mode period, the power on line 124 ceases to be supplied to the decoders 86 and 88 and the display is extinguished.

In operation upon initiation of the system, power is supplied on line 124 to decoders 86 and 88 and primary control 92 has its output on line 96 low and its output on line 98 high. The signals on lines 102 and 104 to control 94 are high so that the output on line 106 to decoder 88 is low and decoder 88 is inhibited providing no output on line 108. The output on temperature display enable line 110 is low so that decoder 86 is inhibited producing no output on lines 112, 114, and 116. The system is in the time mode period and 100 millisecond clock pulses are being fed on line 122 to counter 80. Each time counter 80 completes a full radix count e.g., 10, it constitutes a measurement of 1 second of time and a carry signal is sent to counter 82. A count of 1, representing 1 second, in counter 82 is directly displayed in display 72 indicating a time of 1 second; one-tenth second counts being accumulated in counter 80 are not displayed in display 70 because of the signal on line 119. Each time counter 80 completes a cycle, counter 82 is stepped so that counter 82 successively causes to be displayed the numbers 1, 2, 3, 4, 5, 6, 7, 8 and 9 in display 72. With the next count from counter 80, counter 82 completes its cycle and provides a signal to control 92 which changes the output on line 96 from low to high and that on line 98 from high to low. The low output appears on line 102 and causes the output of control 94 to go high on line 106 enabling decoder 88 to provide an output on line 108 which enables bars b and c in display 74, so that a 1 appears in display 74.

Counter 80 continues to count 100 millisecond clock pulses and counter 82 once again counts each carry signal from counter 80 and immediately displays the number in display 72. Now the numbers provided by counter 82 to display 72 from 1 through 9 represent the times 11 through 19 seconds due to the conjunction of the number in display 72 with the number 1 in display 74.

When counter 82 completes its second cycle of counting, it again supplies a signal to control 92 which causes the output on line 96 to revert to the low state and that on line 98 to revert to the high state. This signals the end of the time mode period on line 100 and once again provides a high input on line 102 to control 94. The end of the time mode period signal on line 100 causes the system to enter the temperature mode period pursuant to which a temperature display enable signal on line 110 enables decoder 86 to produce an output on line 112 to enable bars a, d and f in display 74 in addition to the already enabled bars b and c. Bars b and c remain enabled by the output on line 108 from decoder 88 even though the output on line 102 to control 94 has gone high, because the output on line 104 to control 94 has gone low beginning at the beginning of the temperature mode period so that the output of control 94 on lines 106 remains high.

During the temperature mode period, temperature pulses arriving on line 122 are counted for 1 clock time in accordance with the signal on line 120. In addition to the energization of bars a, d and f line 112 also energizes line 125, the decimal point input, which through display 72 lights decimal point 78.

The temperature range being measured by this system is 90° to 110°F. The temperature sensing circuit 12 and temperature measuring circuit 14 are calibrated so that temperature measuring circuit 14 produces output pulses at the rate of 2,000 pulses per second at a 110°F and zero pulses per second at 90°F. Thus at 100°F 1,000 pulses per second would be produced; at 99°F, 900 pulses per second would be produced, and so on. Since the pulses are sampled for one clock time or 100 milliseconds only one-tenth of that number is actually counted by counter 80. For example, assume that the temperature 99.9°F has been sensed; temperature pulses would then be supplied on line 122 at the rate of 990 pulses per second but only 99 of the pulses would be counted by counter 80 during the 100 millisecond clock time. As the counting begins bars a, d and f and bars b and c are enabled in display 74. In addition the high output on line 98 provides an output on line 116 to enable the g bar in display 74 so that a 9 appears in display 74. Counter 80 counts from 1 to 99 in tenths of degrees and each count is displayed in display 70 which now represents tenths of degrees Fahrenheit. Each time counter 80 has counted a full cycle of 10 counts i.e. at the counts of 10, 20, 30, 40, 50, 60, 70, 80 and 90 a carry signal is sent to counter 82 which in turn registers the numbers 1, 2, 3, 4, 5, 6, 7, 8 and 9, respectively, which are successively displayed in display 72. Since counter 80 stops counting at 99 in this example, counter 82 will never reach a full count and so the output states on lines 96 and 98 of control 92 will not be switched. The final reading from the most significant digit to the least significant digit of displays would be as follows: display 76 would be blank and display 74, 72 and 70 in conjunction with decimal point 78 will read 99.9. Had the temperature sensed been 105°F, temperature pulses would have had a frequency of 1,500 pulses per second which sampled for the one clock time of 100 milliseconds would have caused counter 80 to count 150 counts so that control 92 would have changed state once providing a high output on line 96 and a low output on line 98 which would stop the output on line 116, extinguishing bar g in display 74 and turn on the output on line 114 enabling bar e in display 74. Thus a 0 appears in display 74; enabled bars b and c in display 76 make a 1 appear in display 76 so that display 76, 74, 72 and 70 read 105.0°F.

Figure 5:
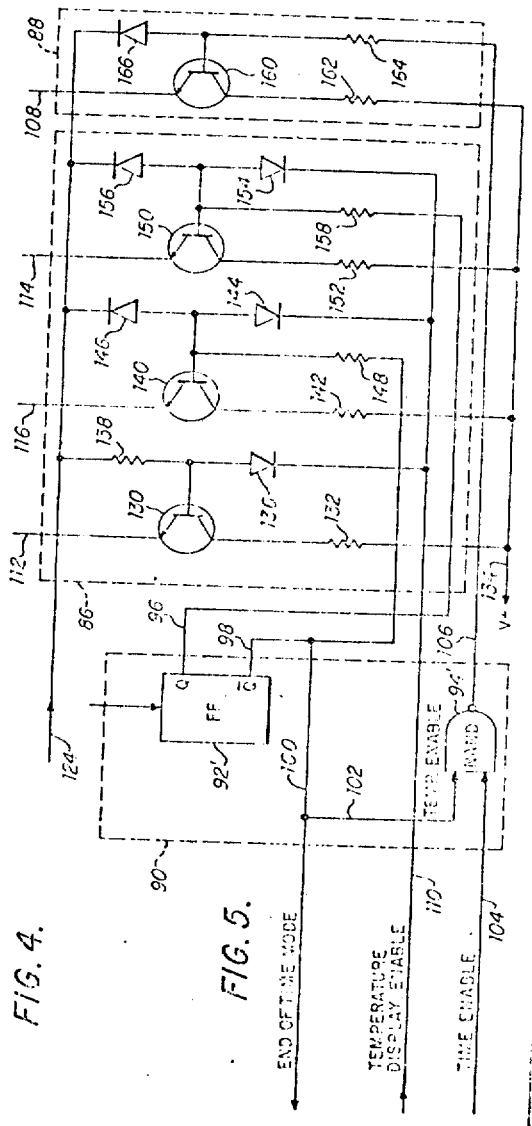
FIG. 5 is a detailed schematic diagram of the display decoder and control circuits shown in FIG. 3.

Control 92 may include a flip-flop 92', FIG. 5, and control 94 may include NAND gate 94'. Decoder 86 includes transistor 130 whose emitter is connected to line 112 and whose collector is connected through resistor 132 to positive power supply bus 134. The base of transistor 130 is connected through diode 136 to temperature display enable line 110 and through resistor 138 to line 124 from automatic on-off electronic switch 48. The emitter of transistor 140 drives line 116. The collector of transistor 140 is connected through resistor 142 to bus 134 and transistor 140 has its base connected through diodes 144 and 146 to lines 110 and 124, respectively. The base of transistor 140 is also connected through resistor 148 to line 98 at the output of flip-flop 92'. Transistor 150 has its emitter connected to line 114 and its collector through resistor 152 to bus 134. The base of transistor 150 is connected through diodes 154 and 156 to lines 134 and 124, respectively. The base of transistor 150 is also connected through resistor 158 to the output of flip-flop 92' on line 96.

Decoder 86 includes transistor 160 whose emitter is connected to line 108 and whose collector is connected through resistor 162 to bus 134. The base of transistor 160 is connected through resistor 164 to line 106 at the output of NAND gate 94' and through diode 166 to line 124.

During the time mode period the temperature display enable signal on line 110 is low. Diodes 136, 144 and 154 are forward biased holding the bases of their respective transistors 130, 140 and 150 in the low state so that those transistors are not conducting; decoder 86 is disabled and there are no outputs on lines 112, 114 and 116. Also in the time mode period during the first cycle of counter 82, i.e., the first 10 seconds line 106 is low so that transistor 106 is also not conducting. However, following that in the remaining 10 seconds of the time mode period and the entire temperature mode period line 106 is high so that transistor 160 is conducting and there is a signal on line 108. At the end of the time mode period and at the beginning of the temperature mode period, the temperature display enable signal appears on line 110 causing it to go high and back bias diodes 136, 144 and 154. Therefore transistor 130 whose base is connected directly through resistor 138 to line 124 immediately begins to conduct providing an output on line 112. Diodes 146 and 156 prevent transistors 140 and 150, respectively, from conducting in response to line 124. However, one of transistors 140 and 150 will be conducting to provide a signal on line 116 and 114, respectively, depending upon the state of flip-flop 92'. If the output on line 96 is high transistor 150 will conduct to provide an output on line 114. If the output on line 98 is high transistor 140 will conduct and provide an output on line 116.

Other embodiments will occur to those skilled in the art and are within the following claims:

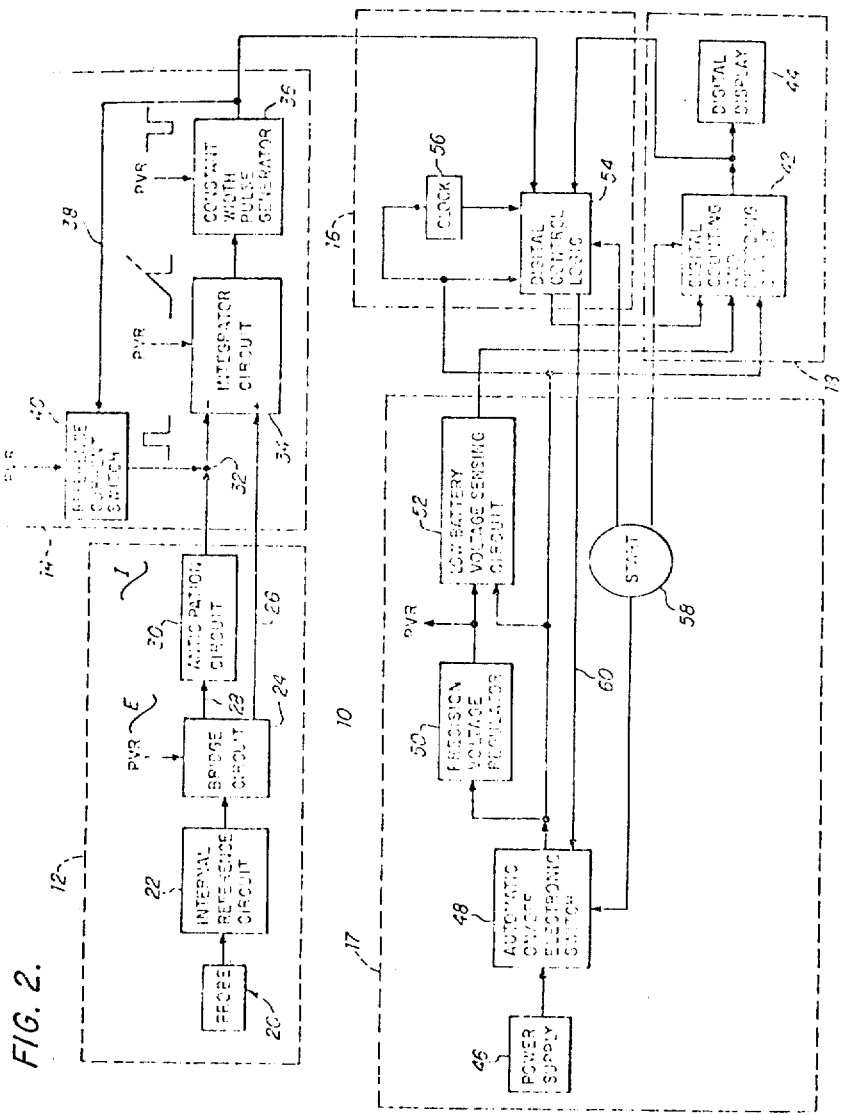

What is claimed is:

1. An electronic thermometer system for measuring and displaying temperature in more than one power of a radix comprising:
    a first radix counter for counting pulses representative of the temperature measured;
    a first display device for displaying the count in said first radix counter;
    a radix power increment switching circuit responsive to said first radix counter cycling through a first radix count for indicating that the first next radix power has been reached; and to said first radix counter cycling through a second radix count for indicating that the second next radix power has been reached;
    a second display device for displaying said first next radix power;
    a third display device for displaying said second next radix power; and
    a decoder responsive to said radix power increment circuit indicating that the first next radix power has been reached for setting a first predetermined number in said second display device and responsive to said radix power increment switching circuit indicating that said second next radix power has been reached for displaying a different predetermined number in said second display device in place of said first predetermined number and displaying a second predetermined number in said third display device.

2. An electronic thermometer system for measuring and displaying temperature in more than one power of a radix comprising:
    a least significant digit radix counter for counting pulses representative of the temperature measured;
    a least significant digit display device for displaying the count in said least significant digit radix counter;
    a next least significant digit radix counter for counting the number of times least significant digit radix counter has cycled through a radix count;
    a next least significant digit display device for displaying the count in said next least significant digit radix counter;
    a radix power increment switching circuit responsive to said next least significant digit radix counter cycling through a first radix count for indicating that the first next radix power has been reached and through a second radix count for indicating that the second next radix power has been reached;
    a next most significant digit display device for displaying said first next radix power;
    a most significant digit display device for displaying said second next radix power;
    a decoder responsive to said radix power increment switching circuit indicating that the first next radix power has been reached for setting a first predetermined number in said next most significant digit display device and responsive to said radix power increment switching circuit indicating that the second next radix power has been reached for setting a predetermined number in said next most significant digit display device and a second predetermined number in said most significant digit display device.

3. An electronic thermometer system for measuring and displaying time in a time mode period and temperature in a temperature mode period in more than one power of a radix comprising:
    a least significant digit radix counter for counting pulses representative of the temperature measured during said temperature mode period and pulses representative of the time measured during said time mode period;
    a least significant digit display device for displaying the count in said least significant digit radix counter during said temperature mode period;
    a next least significant digit radix counter for counting the number of times said least significant digit counter has cycled through a radix count;
a next least significant digit display device for displaying the count in said next least significant digit radix counter;
a radix power increment switching circuit responsive in each said period to said next least significant digit radix counter cycling through a first radix count for indicating that the first next radix power has been reached and through a second radix count for indicating that the second next radix power has been reached;
a next most significant digit display device for displaying said first next radix power;
a most significant digit display device for displaying said second next radix power;
a decoder responsive to said radix power increment switching circuit indicating that the first next radix power has been reached for setting during each period a predetermined number in said next most significant digit display device and responsive to said radix power increment switching circuit indicating that the second next radix power has been reached for setting during said temperature mode period a different predetermined number in said next most significant digit display device and a second predetermined number in said most significant digit display device.

* * * * *

UNITED STATES PATENT OFFICE
CERTIFICATE OF CORRECTION

Patent No. 3,940,595     Dated February 24, 1976

Inventor(s) Robert Bruce Turner     Page 1 of 4

It is certified that error appears in the above-identified patent and that said Letters Patent are hereby corrected as shown below:

Insert the three sheets of drawings as part of Letters Patent 3,940,595.

Signed and Sealed this

*eleventh* Day of *May 1976*

[SEAL]

Attest:

RUTH C. MASON
*Attesting Officer*

C. MARSHALL DANN
*Commissioner of Patents and Trademarks*